United States Patent [19]

Zemek et al.

[11] 4,327,483

[45] May 4, 1982

[54] APPARATUS FOR SELECTING, TRANSPORTING, AND INSERTING SINGLE IN-LINE COMPONENTS

[75] Inventors: Albert W. Zemek, Windsor; Frederick G. Tomko, Vestal; David C. Knapp, Binghamton, all of N.Y.

[73] Assignee: Universal Instruments Corporation, Binghamton, N.Y.

[21] Appl. No.: 46,159

[22] Filed: Jun. 7, 1979

[51] Int. Cl.$^3$ ............................................. H05K 3/30
[52] U.S. Cl. ........................................ 29/741; 29/759
[58] Field of Search .......... 29/741, 739, 759, 832–839, 29/564.1, 564.8

[56] References Cited

U.S. PATENT DOCUMENTS

| | | | |
|---|---|---|---|
| 3,727,284 | 4/1973 | Ragard et al. | 29/741 X |
| 4,030,180 | 6/1977 | Pierson | 29/741 |
| 4,063,347 | 12/1977 | Woodman, Jr. | 29/741 X |

Primary Examiner—Carl E. Hall
Attorney, Agent, or Firm—Fidelman, Wolffe & Waldron

[57] ABSTRACT

An apparatus for individually selecting a number of single in-line package (SIP) components and sequentially inserting them into a printed circuit board. The apparatus has a basic mode of operation, under a program control, comprising a shuttle assembly and a component pickup and insertion assembly, the shuttle assembly transferring a component from a selected one of a plurality of magazines and transferring the component to an unload station. At the unload station, the pickup and insertion assembly picks up the component from the shuttle assembly and rotates to a vertical position for insertion of the component in a printed circuit board. The printed circuit board is mounted on a pantograph mechanism whose position is controlled by a tape reader or a computer which also determines the automatic sequencing of the shuttle block.

34 Claims, 25 Drawing Figures

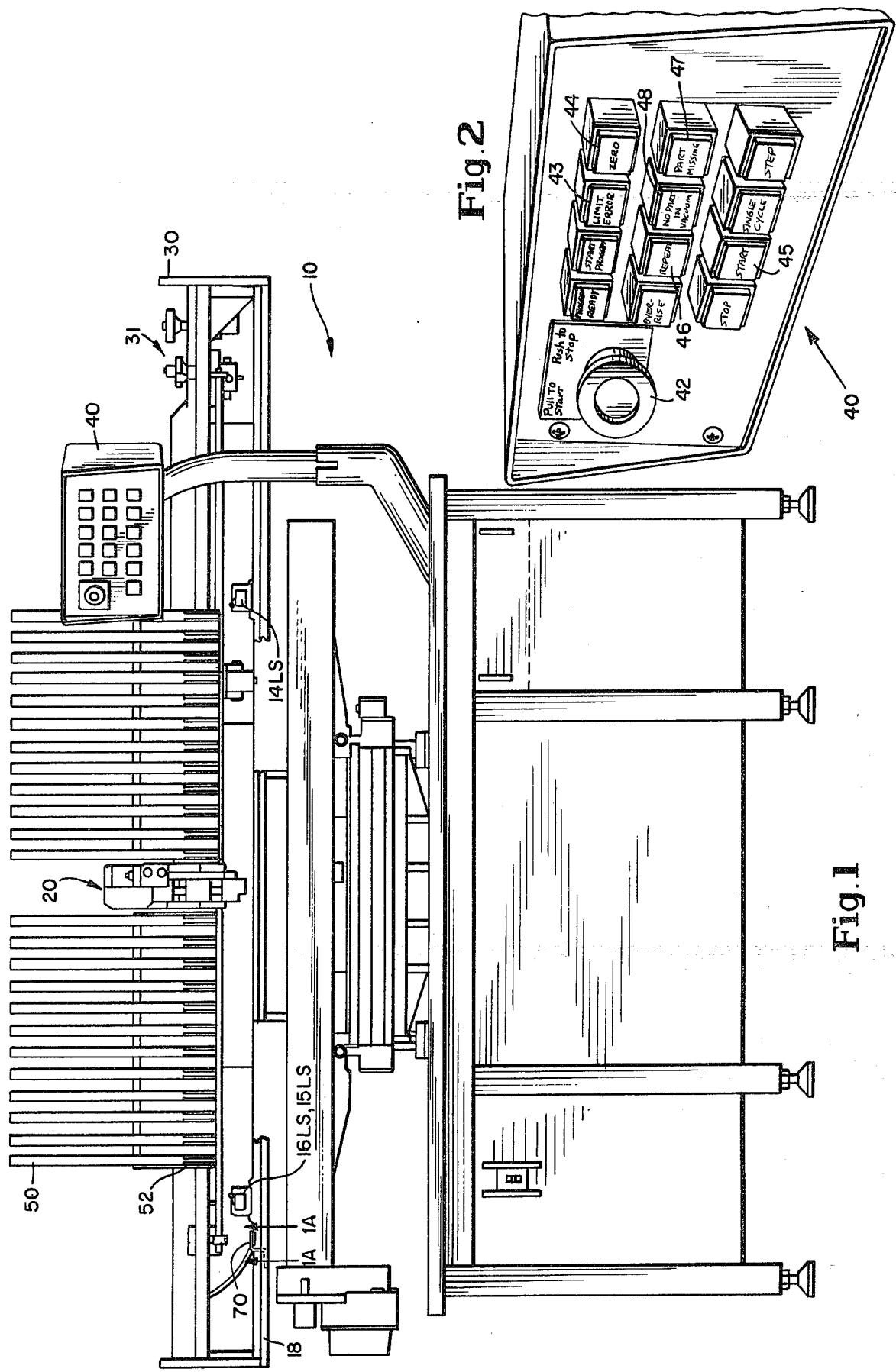

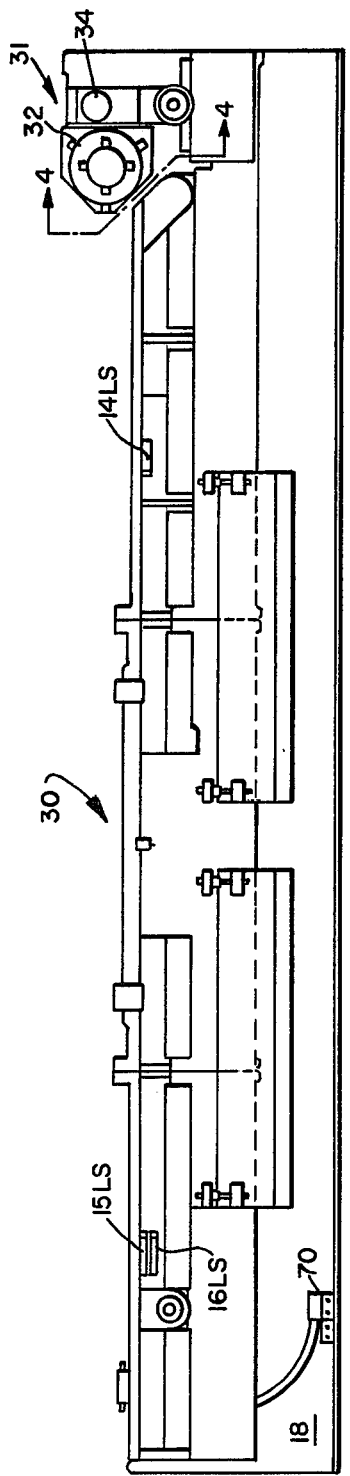
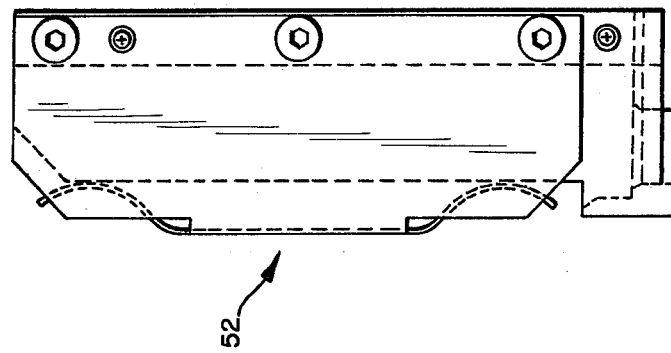
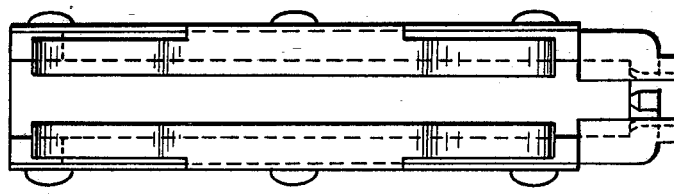
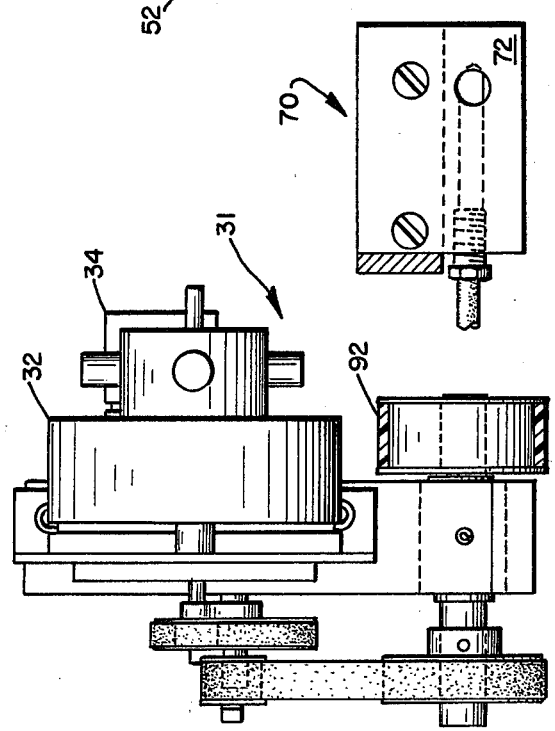

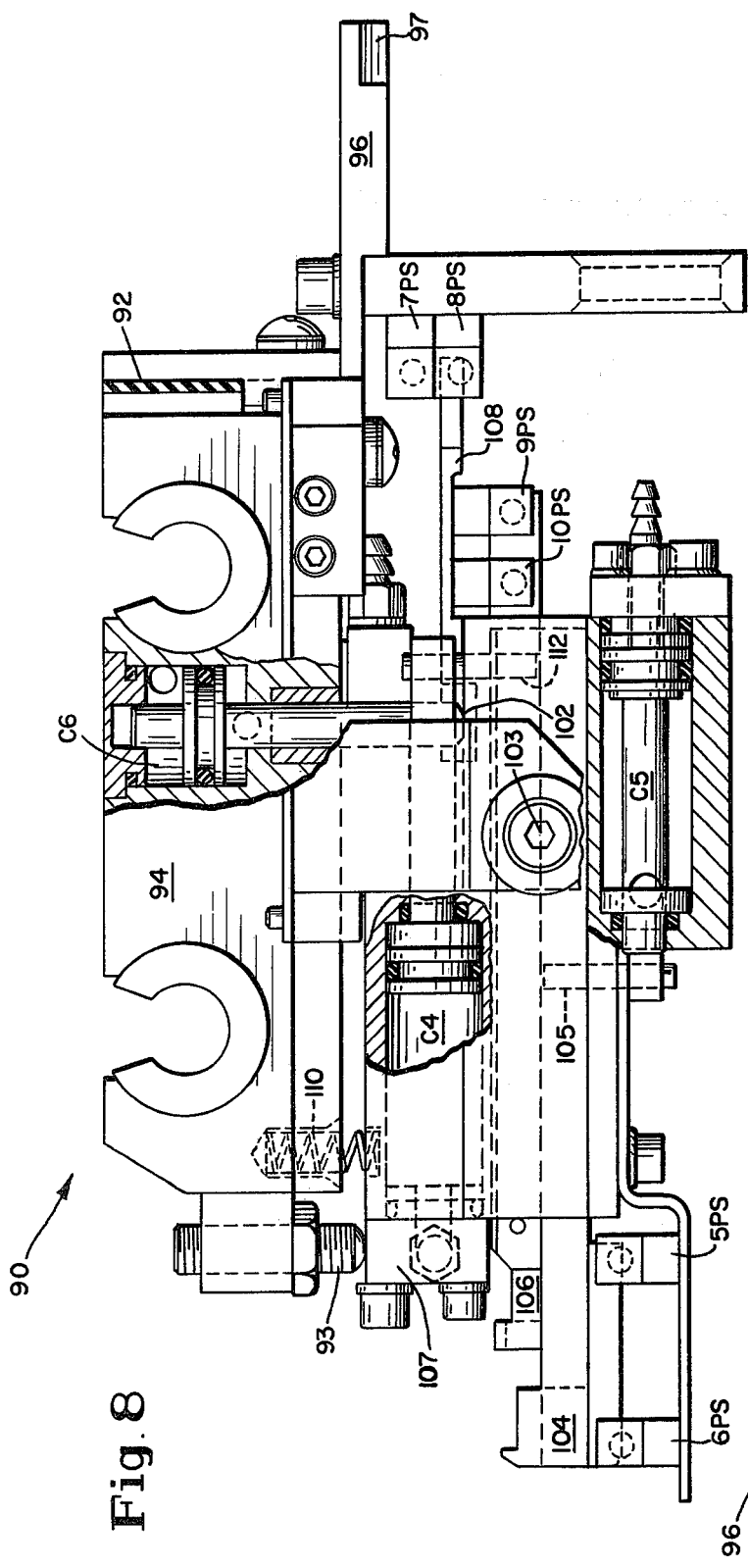
Fig. 8
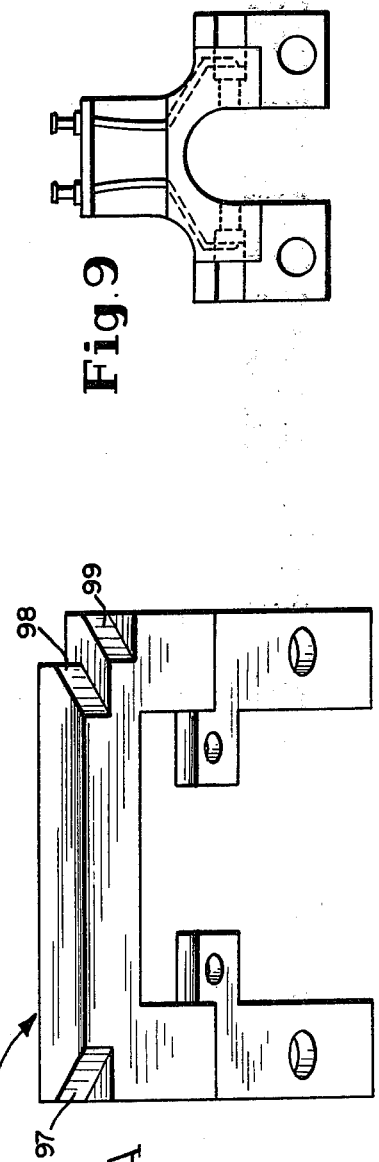
Fig. 9
Fig. 9A

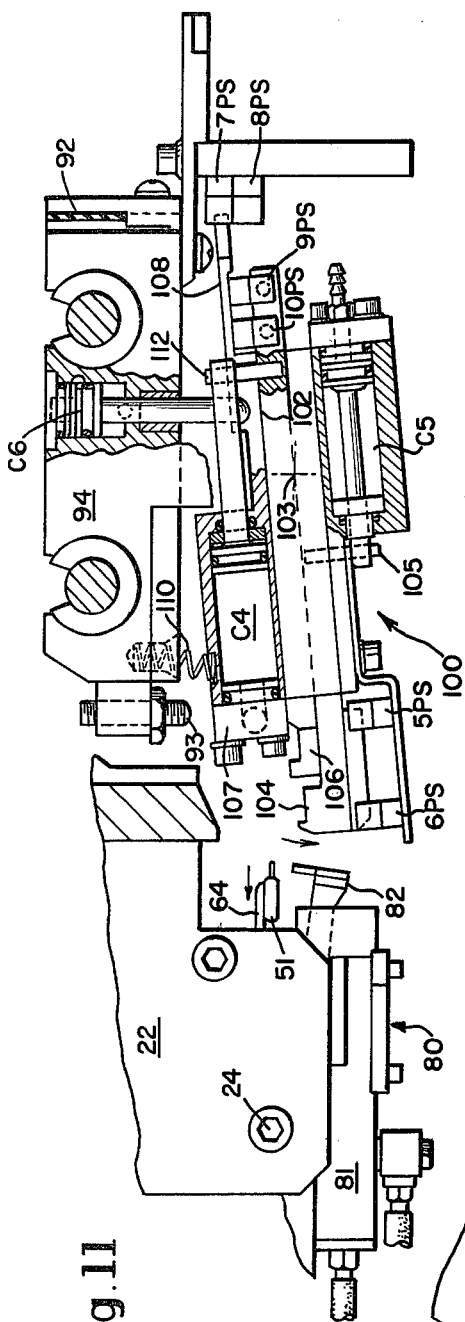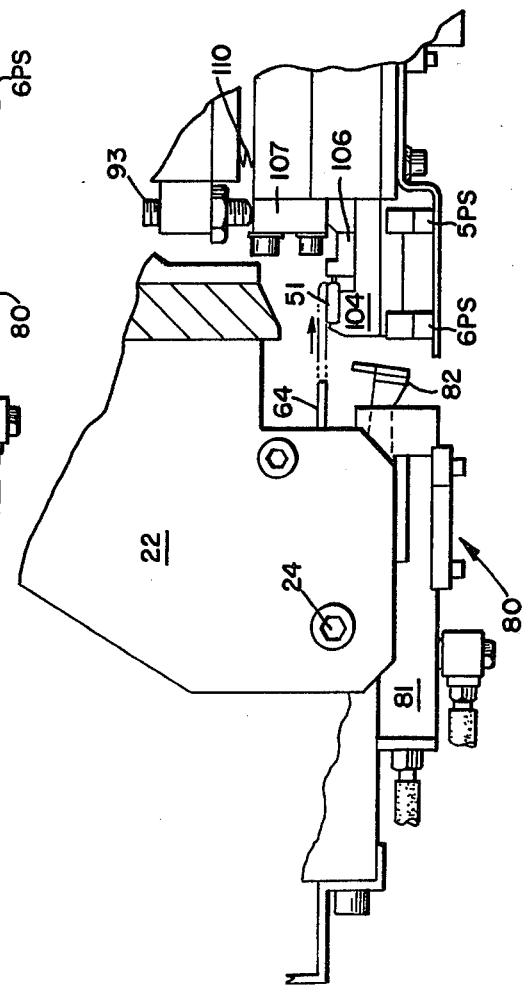
Fig. 11
Fig. 10
Fig. 12

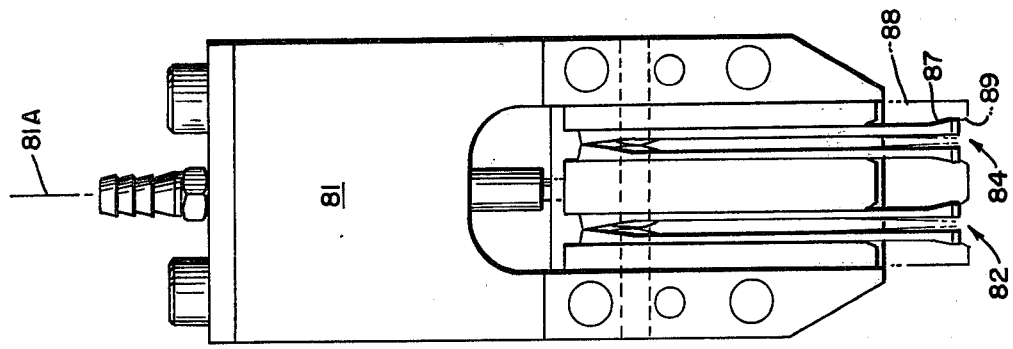
Fig.15
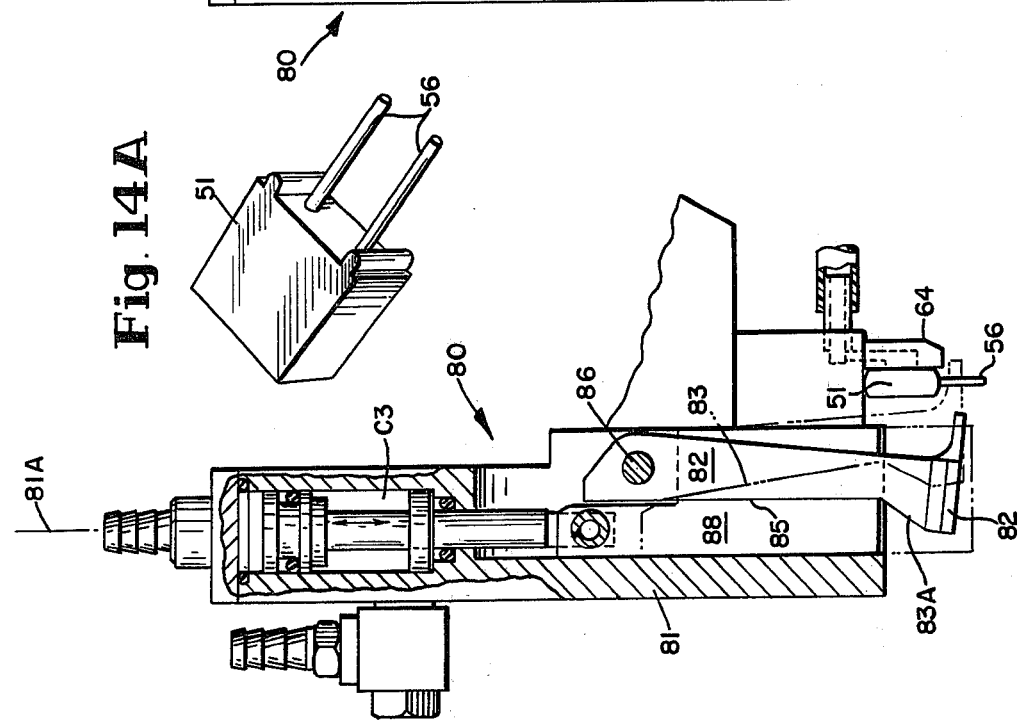
Fig.14A
Fig.14
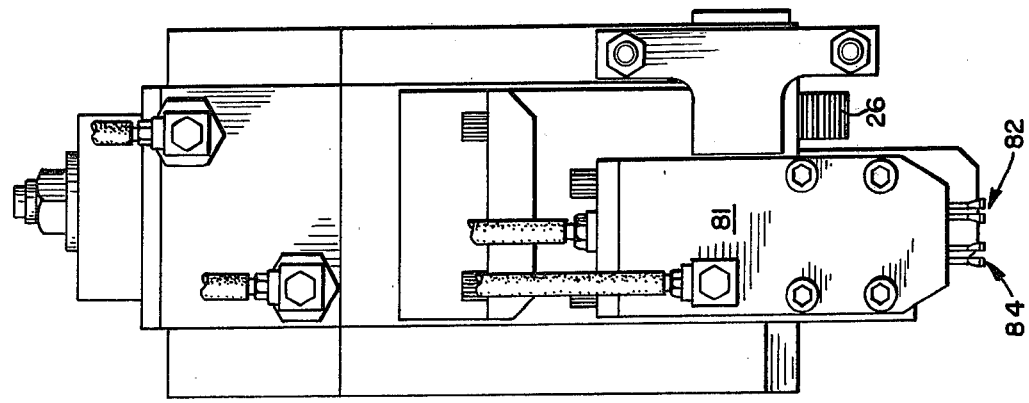
Fig.13

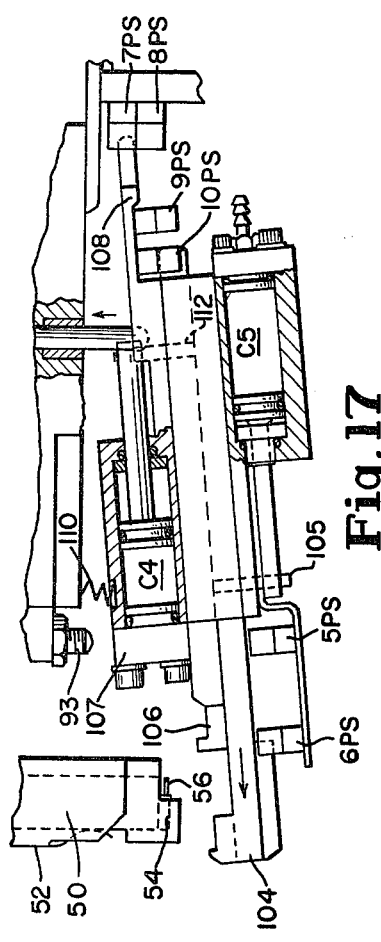
Fig.17
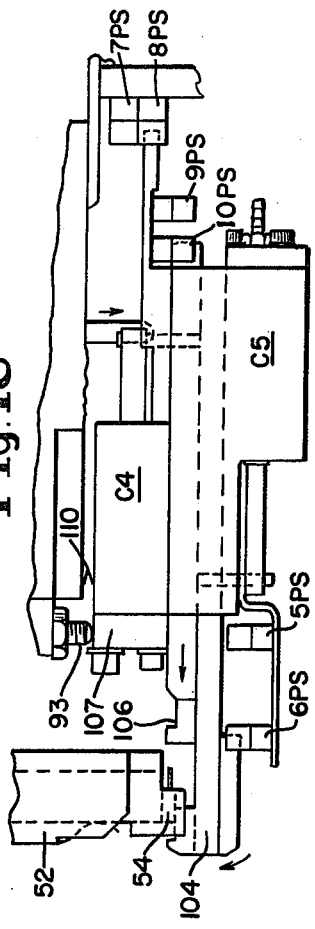
Fig.18
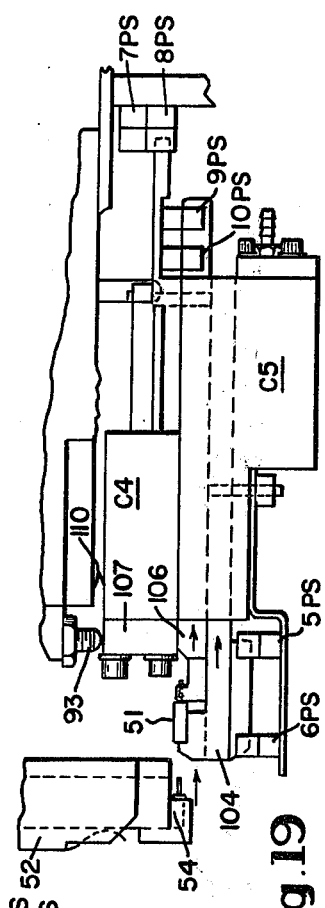
Fig.19
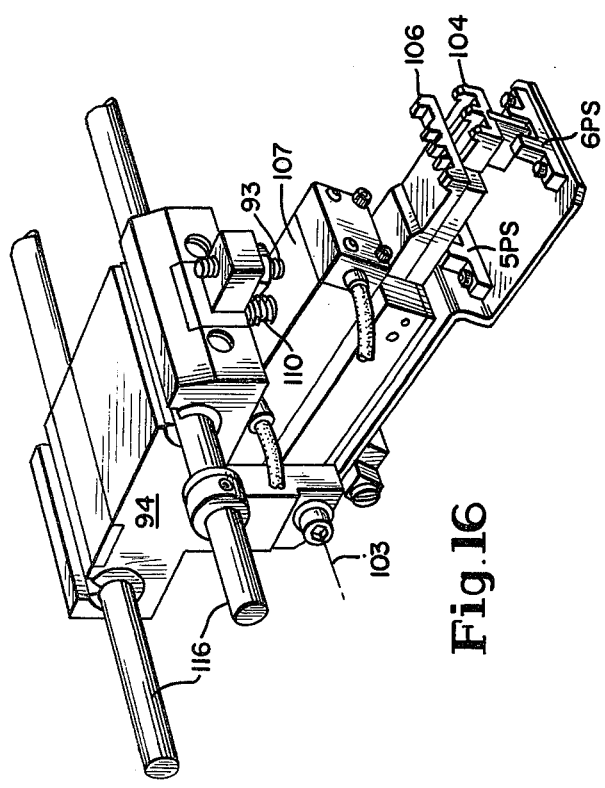
Fig.16
Fig.20

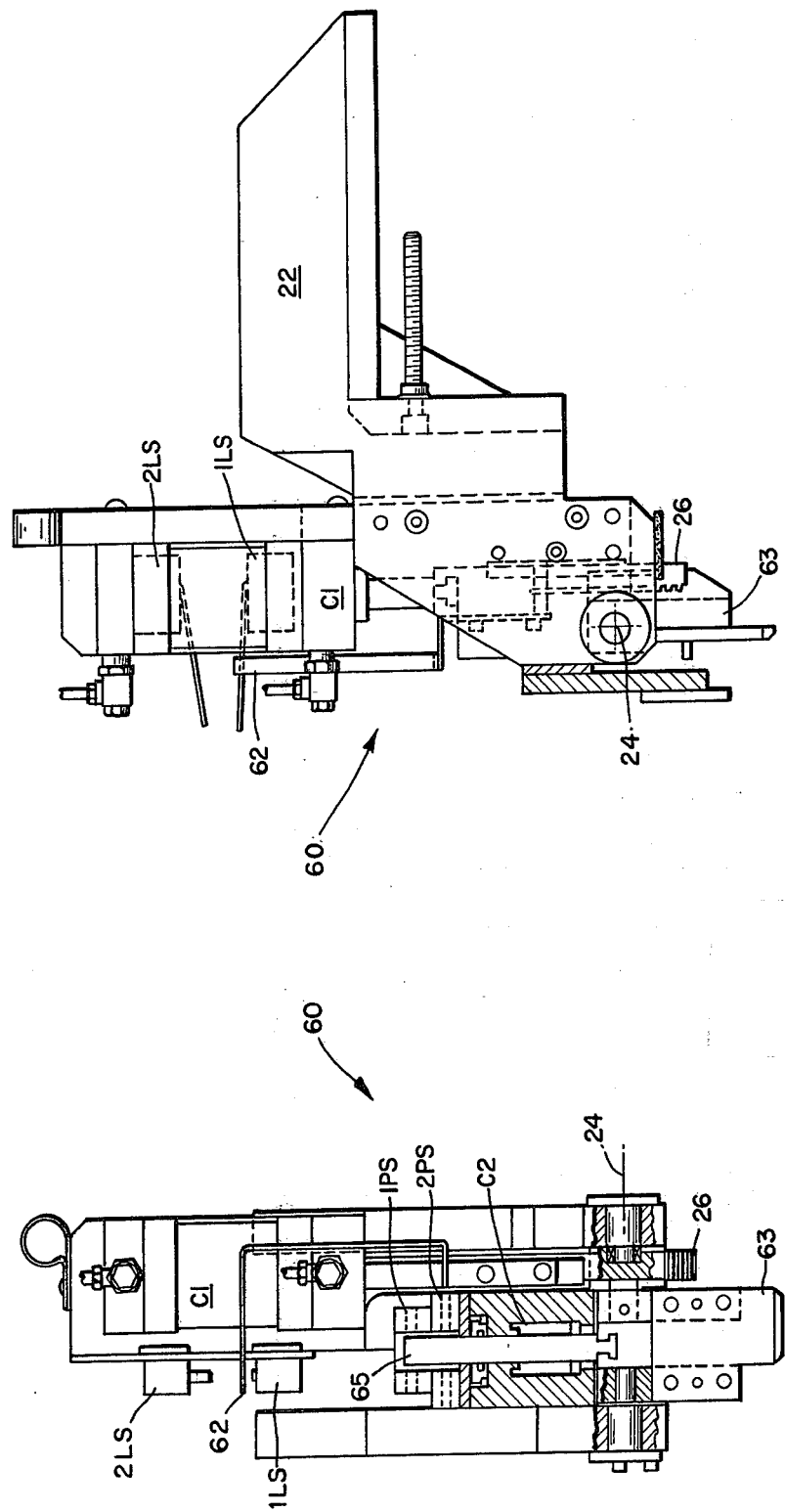

APPARATUS FOR SELECTING, TRANSPORTING, AND INSERTING SINGLE IN-LINE COMPONENTS

BACKGROUND OF THE INVENTION

This invention relates to an apparatus for selecting and inserting single in-line (SIP) components. Such components have a generally parallelepiped body and have a single series of in-line leads extending from one surface of the body. These components usually have two, four, six or eight leads; but they can have more.

There has been a need for an automatic machine to unload the SIP components from a tube, in which they are generally loaded, and to insert them directly into a printed circuit board without damage to the components.

Further, there has been a need for a machine which will not only insert the components into the printed circuit boards, but also provide some versatility in the manner in which the components are inserted. In other words, there has been a need for a machine which can select components from individual magazine tubes in a predetermined sequence and transfer them to an insertion mechanism; but also a need to provide a machine which can select a group of components which are loaded in a predetermined manner in the magazine tubes and then to step or sequence the components into the insertion mechanism in the order selected.

The apparatus of the present invention can accept tubes of loaded components placed in a predetermined manner and can automatically select the components from said loaded tubes, transfer the components to an unload station, transfer the components from the unload station to an insert position and insert the components into a printed circuit board.

In the random access mode, about twenty-four stick carriers or tubes usually are placed on the machine. A moving shuttle, upon command from a tape reader computer, then goes to a predetermined position and removes a component from the selected magazine by means of a clamping and retrieving assembly. The shuttle then transports the component to an unload station where a component pickup and insertion head picks up the component from the shuttle clamping assembly, rotates to an insert position and inserts the SIP component into a printed circuit board. After pickup of the component from the shuttle is completed, the shuttle retrieves another component from a selected magazine.

The pickup and insertion assembly is rotatable between two positions, horizontal and vertical; and a "race" condition occurs (e.g., a race in time between transport of the shuttle assembly to the unload station and rotation of the pickup and insertion assembly to the horizontal position) with the pickup and insertion assembly always rotated to the horizontal position some time before arrival of the shuttle assembly at the unload station. Upon arrival of the shuttle at the unload station, with the pickup and insertion head assembly in the horizontal position, a vacuum block pickup and insertion device is extended above the component clamping mechanism of the shuttle assembly. The vacuum block makes contact with the top of the component, at which time the clamping arm of the shuttle assembly releases the SIP to the vacuum block and swings out of the way. The pickup and insertion device with a SIP held by the vacuum block then retracts and pivots downwardly to the vertical position, while alignment of the component on the vacuum block is accomplished by grasping the leads of the component with alignment fingers. When the pickup and insertion assembly (with alignment sub-assembly) is in the vertical position, the alignment fingers are released from the leads of the component and the component is inserted into a printed circuit board. A conventional type of clinching mechanism is provided underneath the board and, upon command, clinches the leads against the board.

This process is repeated until all of the needed components have been inserted into the circuit board, whereupon another board is placed on the pantograph and the cycle is started over. Accordingly, it is the object of this invention to provide an automatic apparatus for selecting and inserting SIP components into circuit boards.

It is a further object of this invention to provide a novel shuttle assembly which removes the components from the magazines and transports them to an unload station.

It is a further object of this invention to provide a novel pickup and insertion mechanism within a single in-line component insertion apparatus.

It is a further object of this invention to provide a novel shuttle assembly for a random access selection of components in a single in-line component insertion apparatus.

It is a further object of this invention to provide a mechanism having a random access mode.

It is a further object of this invention to provide an automatic SIP component insertion apparatus controlled by a computer or other controlling means.

It is a further object of this invention to provide an alignment sub-assembly for the pickup and insertion assembly, whereby the components are aligned on the vacuum block of the pickup and insertion assembly before insertion into the printed circuit board.

These and other objects of the invention will become readily apparent when reference is taken to the following specification and accompanying drawings in which:

FIG. 1 is a front elevation of the apparatus comprising this invention;

FIG. 1A is a sectional view along lines 1A—1A of FIG. 1, showing the "part remove" vacuum hole;

FIG. 2 is a fragmentary perspective of the control panel;

FIG. 3 is a top plan view of the delivery system;

FIG. 4 is a fragmentary left-hand elevation of the drive and timing means taken along the lines 4—4 of FIG. 3;

FIG. 5 is a front elevation of the magazine assembly;

FIG. 6 is a right-side elevation of the magazine assembly;

FIG. 8 is a right-side elevation of the shuttle assembly, partially in section;

FIG. 9 is an end view of a sensor block assembly;

FIG. 9A is an isometric view of the actuator plate from the rear and the underside;

FIG. 10 is a fragmentary view of the insert head tooling assembly assembly rotated to pickup a SIP from the shuttle assembly;

FIG. 11 is a fragmentary view of the insert head tooling assembly and shuttle assembly, after pickup, with the shuttle assembly dropped down for travel;

FIG. 12 is a fragmentary view of the insert head tooling assembly returning to the vertical position, with the alignment fingers engaging the leads of the SIP;

FIG. 13 is a partial front elevation of the insert head tooling assembly;

FIG. 14 is a fragmentary section through the insert head tooling assembly, showing two positions of the sliding block and alignment fingers of the alignment subassembly;

FIG. 14A is a perspective view of a single in-line package (SIP) component;

FIG. 15 is a rear elevation of the insert head tooling assembly showing two positions of the alignment fingers and sliding block of the alignment subassembly;

FIG. 16 is a perspective view of the shuttle assembly when dropped for travel;

FIG. 17 is a fragmentary section of the shuttle assembly dropped five degrees and extended for SIP pickup;

FIG. 18 is a fragmentary side elevation of the shuttle assembly picking up a SIP from a magazine;

FIG. 19 is a fragmentary side elevation of the shuttle assembly after SIP pickup;

FIG. 20 is a fragmentary side elevation of the shuttle assembly after SIP pickup when dropped five degrees for travel;

FIGS. 21 and 22 are, respectively, a front elevation (partially in section) and a right side elevation of the insert head tooling assembly.

MACHINE ASSEMBLIES

Figure 7:
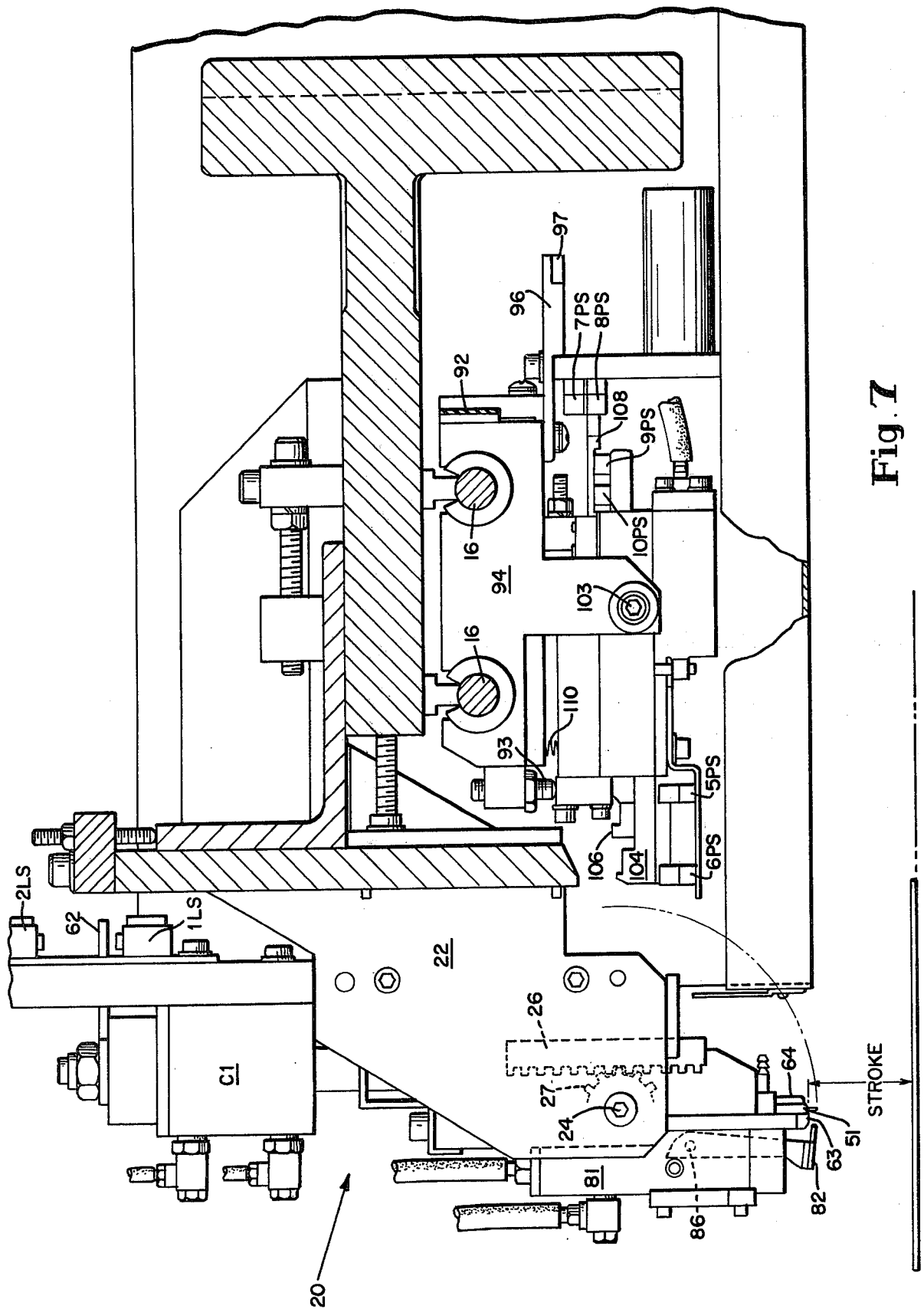
FIG. 7 is a right-side elevation of the insert head and shuttle assemblies, partially in section.

The Console Assembly of FIG. 1 is a desk-type cabinet which supports the machine asssemblies. The Console Assembly 10 is designed to provide convenient access, for operation and maintenance purposes, to all of the machine assemblies. The top surface of the Console Assembly cabinet supports an X-Y Table Assembly, a SIP Clinch Assembly, and a C-Frame Assembly. The C-Frame Assembly supports the Insert Head Assembly 20, Delivery Assembly 30, Shuttle Assembly and a Pneumatic Assembly. The Pneumatic Assembly contains the various solenoid valves which control distribution of air to associated air cylinders. The air cylinders are located on or near the mechanical devices that they actuate. Console Assembly 10 also supports a machine control panel indicated at 40.

The Clinch Assembly, X-Y Table Assembly, and Delivery Assembly are standard types, examples of which are disclosed respectively in Ser. No. 875,855 by Zemek et al filed Feb. 7, 1978 and in U.S. Pat. Nos. 3,972,100 of Zemek et al and 3,727,284 of Ragard et al.

In one embodiment of the instant invention, the Delivery Assembly 30 of FIG. 3 provides a mounting surface for 24 SIP magazines 50 (best seen in FIG. 1) supported by magazine supports 52 of FIGS. 5 and 6 and the shuttle Drive Assembly 31 of FIG. 4. SIP magazines numbered 1 through 12 mount on the left side of an unload station, while magazines numbered 13 through 24 are located on the right side of the unload station. A SIP Insert Head Assembly 20 mounts to the Delivery System 30, between the left and right groups of magazines and opposite of the shuttle unload station.

The Drive Assembly 31 located at the right end of the Delivery System 30 contains a servo motor 32 and rotary encoder 34. The servo motor 32 drives the shuttle 90, via the shuttle drive belt 92, to program selected magazines 50 and to the unload station. The servo motor 32 is controlled by outputs from a program controller (not shown), while the rotary encoder 34 continually transmits shuttle movement data to the program controller.

As best seen in FIGS. 1 and 3, a shuttle left limit switch 15LS and an in-range switch 16LS are located immediately to the left of magazine number 1, and a right limit switch 14LS is located immediately to the right of magazine number 24.

SHUTTLE ASSEMBLY

A shuttle assembly (SA) 90 (located behind a row of SIP magazines 50 as seen in FIGS. 16-20 is a servomotor driven transport riding on guide and support rods 16 and is positioned, according to a program, at a selected magazine for removal of the bottom SIP 54 of the magazine and transporting it to an unload station. At the unload station, the SIP 51 is transferred to the SIP pickup and insertion head assembly 20. A shuttle timing belt 92 (as seen in FIG. 7) connects the shuttle assembly 90 to the drive assembly servo-motor 32. Referring to FIGS. 8 and 11, Shuttle assembly (SA) 90 has a non-rotatable block 94 having a pivot piston/cylinder C6 that abuts against the top rear portion 102 of a rotatable shuttle tool assembly (STA) generally indicated at 100. STA 100 has retriever 104 and clamp 106 which are separately extended by piston/cylinder C5 and piston/cylinder C4 respectively.

Actuator plate 96 is also attached to non-rotatable shuttle block 90 and has ramps 97, 98, and 99 (as best seen in FIG. 9A) for respectively actuating the limit switches 14LS, 15LS, and in-range switch 16LS of FIGS. 1 and 3.

Attached to STA 100 is a photo sensor array 9PS and 10PS for detection of the extended or retracted positions of the clamp 106. Also attached to the STA 100 is a photo sensor array 5PS and 6PS for detection of the extended and retracted positions of the retriever 104. Attached to the non-rotatable shuttle block 94 are photo sensors 7PS and 8PS, which cooperate with a rearwardly extending arm 108 of the rotatable STA 100 to indicate whether the rotatable STA 100 is in a horizontal or non-horizontal position (e.g., 5° below horizontal); when the rotatable STA 100 is horizontal, 7PS is open and 8PS is closed.

Referring to FIGS. 16-20, when shuttle 90 is travelling to a selected magazine 50, the front end (the left end in FIGS. 17-20) of the STA 100 is in the down position of 5° below horizontal under the bias of compression spring 110 (7PS is closed and 8PS is open) and the retriever 104 and clamp 106 are in the retracted position. Upon arrival at a selected magazine 50, retriever piston/cylinder C5 is extended. Retriever 104, attached by a vertical rod 105 to piston/cylinder C5, is likewise extended, thereby opening photo sensors 5PS and 6PS to actuate piston/cylinder C6. Piston/cylinder C6 extends to rotate STA 100 about a pivot point 103 (best seen in FIG. 8) so that the housing 107 of piston/cylinder C4 abuts a stop 93 and the rear extension arm 108 closes photo sensor 8PS, indicating that retriever 104 is in the horizontal position of FIG. 18. Retriever 104 is now in engagement with the bottom of the lowermost SIP 54 of the selected magazine. The closing of photo sensor 8PS also actuates piston/cylinder C4, attached by a vertical arm 112 to the clamp 106, and extends the clamp 106 for clamping the bottom SIP 54 to the retriever 104 while opening photo sensors 9PS and 10PS. The opening of photo sensor 9PS and 10PS causes piston/cylinder C4 to extend and piston/cylinder C5 to retract, thereby causing retraction of retriever 104 and clamp 106 and removal of a clamped SIP 51 from the magazine support 52, as seen in FIG. 19. Retriever 104 then closes photo sensors 5PS and 6PS and clamp 106 closes photosensors 9PS and 10PS, whereupon piston/cylinder C6 is retracted, allowing the front end of the STA 100 (with SIP) to rotate downwardly under the influence of compression spring 110 to the position of FIG. 20 and allowing the rear extension arm 108 of STA 100 to rotate upwardly to open photo sensor 8PS and close photo sensor 7PS. Closing of photo sensor 7PS actuates the delivery assembly servo-motor 32 to drive shuttle assembly 90 to the shuttle unload station opposite of the SIP insert head assembly (IHA) 20.

SIP INSERT HEAD ASSEMBLY

Referring to FIGS. 7 and 10–15, the SIP insert head assembly (IHA) 20 is affixedly mounted on support 22 in front of the row of magazines 50 and opposite of the shuttle unload station with, for example, an equal number of SIP magazines 50 on either side of the unload station. The insert head assembly 20 comprises an insert head tooling assembly (IHTA) 60 (FIGS. 21 and 22) and an alignment subassembly 80 mounted onto the insert head 20, such that they are rotatable together at pivot point 24. By means of a piston/cylinder C1 which is affixedly mounted on the insert head support 22, and an extendable and retractable rack 26 which cooperates with rotation gear 27, the IHTA 60 and alignment assembly 80 may be rotated as an entity between the extreme vertical and horizontal positions as shown in FIGS. 7 and 10 respectively.

Attached to the piston of piston/cylinder C1 is a switch actuator arm 62 which actuates microswitches 1LS or 2LS when the IHTA 60 is, respectively, in the vertical or horizontal positions.

The rotatable IHTA 60 includes a piston/cylinder C2 FIG. 21 for extension and retraction of the insert head 63 with vacuum block 64. The upper end 65 of the piston of piston/cylinder C2 extends through the top of the cylinder to cooperate with photo sensors 1PS and 2PS for sensing this extension or retraction. There are two different instances and degrees of extension of the insert head 63 with vacuum block 64:

1. Extension while in the horizontal position for pick up of a SIP from the shuttle, and
2. Extension while in the vertical position for insert of the SIP into a printed circuit board which is mounted on the X-Y table assembly.

When the insert head 63 with vacuum block 64 is retracted, both photo sensors 1PS and 2PS are closed. In the first instance of extension, for pick-up of a SIP, only photo sensor 1PS is opened. In the second instance of extension, for insertion of a SIP into a printed circuit board, both photo sensors 1PS and 2PS are opened at the completion of a proper (full stroke) insertion of a SIP into the printed circuit board. However, if the SIP leads 56 miss the holes of the printed circuit board, thus preventing the insert head 63 from completing a full downward insert stroke, only photo sensor 1PS is opened, the machine is halted, and a "missed insert" signal is actuated. This condition of "missed insert" will be explained in a later section.

ALIGNMENT SUBASSEMBLY

The alignment subassembly 80 of FIGS. 13, 14 and 15 comprises a housing 81 with two pairs of alignment fingers 82, 84 which are pivotal at 86 within the confines of housing 81. Each finger has an outwardly flared portion as at 87 for cooperation with a rounded portion as at 89 of a slide block 88. This slide block 88 is reciprocable up and down by means of an alignment piston/cylinder C3. Surfaces 85 of this slide block are slidable along surfaces 83 of the pivotable fingers, such that (when in the position indicated by the phantom lines of FIGS. 14 and 15) the bottom end of the fingers 82, which are rearwardly flared as at 83A to form a camming surface, are forced (counterclockwise) away from the center line 81A of the piston/cylinder C3. At the same time, rounded portions 89 of the slide block 88 engage outwardly flared portions 87 of the alignment fingers 82, 84 to urge the fingers into clamping engagement with the leads 56 of a SIP, and thereby to align the SIP properly on the vacuum block 64 of the IHTA 60 that is holding the SIP.

SIP PICKUP CYCLE

During the aforementioned race condition, the shuttle 90 delivers a SIP 51 to the unload station and the IHTA 60 is rotated from the vertical position of FIG. 7 to the horizontal position by retraction of rotation piston/cylinder C1, thereby retracting rack 26 and rotating gear 27 to cause this rotation of IHTA 60 to the horizontal position of FIG. 10. During this rotation of IHTA 60, alignment piston/cylinder C3 and insert piston/cylinder C2 are in their retracted positions.

When the horizontal position is attained, switch actuator 62 actuates micro-switch 2LS which, in turn, actuates the insert head piston/cylinder C2 for extension and pickup from the shuttle assembly 90 as seen in phantom in FIG. 10. Also at this time, vacuum is applied to vacuum block 64 for holding SIP 51 to be picked up. A "part in vacuum" sensor 1PV, which is a pressure or vacuum actuated switch (not shown), senses whether or not SIP 51 is registered with the insert head vacuum block 64. If SIP 51 is not present on vacuum block 64, machine operation will cease and a "no-part in vacuum" indicator will light. This condition will be discussed later. If SIP 51 is present on vacuum block 64, the STA clamp 106 will retract and pivot piston/cylinder C6 will also retract allowing STA 100 to be biased downwardly by spring 110. Then insert head 63 and vacuum block 64, with SIP 51, will be retracted (as in FIG. 11) by the insert head piston/cylinder C2, and alignment piston/cylinder C3 will be extended to cause grasping of SIP leads 56, per the previous description of the alignment subassembly 80. With retraction of the insert head 63 and vacuum block 64, both photo sensors 1PS and 2PS will be closed and the shuttle assembly 90 will move to the next programmed magazine for pickup of another SIP; rotate piston/cylinder C1 is extended, causing IHTA 60 to rotate to the vertical position. This causes switch actuator arm 62 to actuate micro-switch 1LS for retraction of the alignment piston/cylinder C3 and the release of the alignment fingers 82, 84. At this time, insert piston/cylinder C2 is fully extended to drive the leads 56 of SIP 51 into the holes of the printed circuit board, and there is a time delay (for instance, 50 milliseconds) after which the REPEAT indicator lights if there is a missed insert. When both photo sensors 1PS and 2PS are opened (indicating full insertion), a clinch assembly is actuated to clinch SIP 51 onto the PC board and the insert piston/cylinder C2 is fully retracted for the next cycle.

The machine control panel 40 of FIG. 2 includes a plurality of translucent push-button type control switches (each having indicator lamps therein for indication of a particular condition of the machine), in addition to the main start/stop switch 42 for the machine. Several of these particular conditions will now be discussed.

LIMIT ERROR

The "limit error" condition occurs when either the X-Y table or shuttle assembly 90 overtravels and actuates an associated limit switch (as at 14LS and 15LS in FIGS. 1 and 3) for the shuttle assembly. This condition causes the LIMIT ERROR indicator 43 to illuminate and the machine operation to stop, thereby indicating a malfunction to the operator who must push the PULL TO START/PUSH TO STOP palm switch 42 to STOP and manually move the X-Y table or the shuttle 90 off the limit switch. The operator must then pull the palm switch 42 to START when complete and push the ZERO push button. At this point, the operator would decide whether the board being run at the time the limit error was encountered should be completed or discarded. If the board should be discarded, he would then return to operation with a new board, press START push button 45 and the machine would resume inserting at the first insert location of the current offset.

MISSED INSERT

The REPEAT indicator 46 illuminates to indicate that the insert cycle has not been properly completed. This condition occurs when the SIP leads 56 miss the circuit board holes, thus preventing the insertion head 63 from completing its downward (insertion) stroke; the insert down sensor fails to be actuated, machine operation stops, and the REPEAT indicator 46 lights. The operator must visually check the circuit board being processed and, if necessary, remove the misinserted SIP 51 from the work surface and press the REPEAT push button 46. The shuttle 90 will return to the last selected magazine 50, pick up a SIP 51, and the insert cycle will be repeated at the same board position. Normal operation will resume automatically.

PART MISSING

A part missing condition, indicated by the PART MISSING light 47, will occur whenever the shuttle fails to obtain a SIP 51 from the programmed magazine 50. To recover from this condition, the operator must visually check SIP magazines 50, replace empty magazines with filled magazines, and press the PART MISSING push button; the shuttle 90 will attempt to obtain a SIP from the same magazine. If a SIP is obtained, the PART MISSING indicator 47 will extinguish and normal operation will automatically resume; if a SIP is not obtained, the operator must press the PART MISSING push button 47 again. If alternate (secondary) magazines are programmed, the shuttle 90 will move to the alternate magazine and attempt loading; otherwise the shuttle will continue to attempt loading at the primary magazine. The operator must continue pressing PART MISSING push button 47 until shuttle 90 obtains a SIP from either the primary or an alternate magazine.

When the shuttle has obtained a SIP from the programmed magazine, the PART MISSING indicator 47 will extinguish and normal operation will automatically resume.

NO PART IN VACUUM

The SIP Insertion Head 63 rotates to the horizontal position to obtain SIP 51 from shuttle 90, rotates back to the vertical position, and then drives the SIP down to the circuit board. During this cycle, SIP 51 should remain held in position on the head vacuum block 64 as in FIG. 11. When SIP 51 is not present on vacuum block 64 during the cycle, machine operation will stop and the NO PART IN VACUUM indicator 48 will light. To resume operation, the operator must press the NO PART IN VACUUM push button 48, at which time shuttle 90 will return to the last selected magazine, pick up a SIP, and the insert cycle will be repeated at the same board position. Normal operation will resume automatically.

PART REMOVE

In addition, there is a PART REMOVE function accomplished at the time of rezeroing (resetting the computer for a pattern program) or whenever there is a power ON/OFF change (which necessitates rezeroing). At rezeroing, if a SIP is in the shuttle assembly 90, the shuttle automatically goes to a zero position and actuates in-range switch 16LS by means of ramp 99 of actuator plate 96 (on the left of the machine in FIG. 1). A "part remove" vacuum block 70 (seen in FIGS. 1, 1A, and 3) is located at this zero position and vacuum is applied to block 70 only if photo sensor 10PS senses that a SIP is clamped in the shuttle tooling assembly 100. Shuttle tooling assembly 100 is in the down position when it arrives at the "part remove" vacuum block.

Vacuum block 70 is mounted at a 5° angle such that the face 72 of block 70 is slightly spaced from the SIP which is held by the STA 100. STA 100 is then unclamped and the SIP is held by the vacuum block 70; SA 90 moves away from zero position, vacuum is removed from block 70, and the SIP drops onto a tray 18 of the console 10.

We claim:

1. An apparatus for inserting electronic components, said electronic components having a body and a single series of in-line leads extending from a surface of said body, said apparatus comprising a component supply assembly having individual magazines for supply of said components one at a time, extensible and retractable shuttle means for gripping and positively extracting individual components from said component supply means and transporting said components to an unload station, movable component insertion means adjacent to said unload station, said component insertion means including a component pickup means for transfer of said components from said shuttle means to said insertion means at said unload station.

2. An apparatus as in claim 1, further comprising a means for receiving rejected components that are not transferred to said insertion means from said shuttle means, a delivery assembly having a slide support means for said shuttle means and a drive means for imparting lateral movement to said shuttle means along said slide support means.

3. An apparatus as in claim 2 wherein said drive means comprises a servo motor and a drive belt attachable to said shuttle means and said servo motor whereby said servo motor imparts drive to said shuttle means through said drive belt.

4. An apparatus as in claim 2, wherein said delivery assembly further comprises a rotary encoder means for continually transmitting movement data of said shuttle means to a controller, and left and right limit switches actuatable by said shuttle means to respectively indicate the extreme right and left limits of travel of said shuttle means along said slide support means.

5. An apparatus as in claim 2, wherein said delivery assembly further comprises a part remove means at a part remove station for removing a component from said shuttle means and dropping said component onto said receiving means upon command.

6. An apparatus as in claim 5, wherein said delivery assembly further comprises an in-range switch adjacent said part remove station and actuatable by said shuttle means to indicate that said shuttle means is at said part remove station.

7. An apparatus as in claim 1, wherein said shuttle means comprises a carriage and a shuttle tooling assembly pivotally supported by said carriage for pivoting between an up position and a down position, said shuttle tooling assembly having a front end and a top rear portion.

8. An apparatus as in claim 7, wherein said carriage comprises an up stop, a pivot means for pivoting said front end to said up position whereby said front end abuts said up stop, a down stop means for abutting said top rear portion to provide a limit of travel for said front end in said down position, and a return means for pivoting said front end to said down position.

9. An apparatus as in claim 8, wherein said front end in said up position is disposed substantially horizontally and in said down position is disposed approximately five degrees below horizontal.

10. An apparatus as in claim 8, wherein said pivot means includes a piston rod bearing against said top rear portion and said return means includes a compression spring bearing against said front end.

11. An apparatus as in claim 7, wherein said carriage comprises an actuator means for actuating switch means for indicating particular positions of said shuttle means.

12. An apparatus as in claim 7, wherein said shuttle tooling assembly further comprises a retriever reciprocatable between an extended position and a retracted position, and a clamp reciprocatable, relative to said retriever, between a clamped position and a retracted clamped position.

13. An apparatus as in claim 1, wherein said insertion means comprises a support block and an insert head tooling assembly rotatably supported by said support block, said support block including a rotate means for rotating said insert head tooling assembly between a first position and a second position.

14. An apparatus as in claim 13, wherein said rotate means comprises a first cylinder and piston, said piston connected to a first gear, said first gear engaging a second gear affixed to said insert head tooling assembly for rotation of said insert head tooling assembly.

15. An apparatus as in claim 14, wherein said support block includes a first switch and a second switch, said piston includes an actuator means for actuating said first switch when said insert head tooling assembly is in said first position and actuating said second switch when said insert head tooling assembly is in said second position.

16. An apparatus as in claim 13, wherein said insert head tooling assembly comprises a reciprocatable insert head and an insert actuator means for extending and retracting said insert head.

17. An apparatus as in claim 16, wherein said insert actuator means comprises a second cylinder and piston, the piston of said second cylinder and piston including an upper end and a lower end, said lower end attached to said insert head.

18. An apparatus as in claim 16, wherein said pickup means is a vacuum block means for holding said component in engagement with said insert head, said vacuum block means being attached to said insert head.

19. An apparatus as in claim 18, wherein said insert head tooling assembly further comprises an alignment means for alignment of said component on said vacuum block means.

20. An apparatus as in claim 18, wherein said insert head tooling assembly further comprises an alignment means attached to said insert head and comprising pivotal finger means for grasping said leads of said component and aligning said component on said insert head.

21. An apparatus as in claim 1 wherein said apparatus includes a pantograph means, located directly under said insertion means, for supporting a printed circuit board having predrilled holes and positioning said board relative to said insertion means to receive the leads of said components in said holes.

22. An apparatus as in claim 1, and further comprising sensor means for sensing predetermined positions of said shuttle means and said insertion means and producing signals.

23. An apparatus as in claim 1, and further comprising a computer means for automatically sequencing the operations of said shuttle means and said insertion means.

24. An apparatus for inserting electronic components, said electronic components having a body and a single series of in-line leads extending from a surface of said body, said apparatus comprising a component supply assembly having individual magazines for supply of said components one at a time, extensible and retractable shuttle means for retrieving individual components from said component supply means and transporting said components to an unload station, movable component insertion means adjacent to said unload station, said component insertion means including a component pickup means for transfer of said components from said shuttle means to said insertion means at said unload station, means for receiving rejected components that are not transferred to said insertion means from said shuttle means, a delivery assembly having a slide support means for said shuttle means and drive means for imparting lateral movement to said shuttle means along said slide support means, said delivery assembly further comprising a part remove means at a part remove station for removing a component from said shuttle means and dropping said component onto said receiving means upon command.

25. An apparatus as in claim 24, wherein said delivery assembly further comprises an in-range switch adjacent said part remove station and actuatable by said shuttle means to indicate that said shuttle means is at said part remove station.

26. An apparatus for inserting electronic components, said electronic components having a body and a single series of in-line leads extending from a surface of said body, said apparatus comprising a component supply assembly having individual magazines for supply of said components one at a time, extensible and retractable shuttle means for retrieving individual components from said component supply means and transporting said components to an unload station, movable component insertion means adjacent to said unload station, said component insertion means including a component pickup means for transfer of said components from said shuttle means to said insertion means at said unload station, means for receiving rejected components that are not transferred to said insertion means from said shuttle means, a delivery assembly having a slide support means for said shuttle means and drive means for imparting lateral movement to said shuttle means along said slide support means, said shuttle means comprising a carriage and a shuttle tooling assembly pivotally supported by said carriage and pivotable between an up position and a down position, said shuttle tooling assembly having a front end and a top rear portion.

27. An apparatus as in claim 26, wherein said carriage comprises an up stop, a pivot means for pivoting said front end to said up position whereby said front end abuts said up stop, a down stop means for abutting said top rear portion to provide a limit of travel for said front end in said down position, and a return means for pivoting said front end to said down position.

28. An apparatus as in claim 27, wherein said front end in said up position is disposed substantially horizontally and in said down position is disposed approximately five degrees below horizontal.

29. An apparatus as in claim 27, wherein said pivot means includes a piston rod bearing against said top rear portion and said return means includes a compression spring bearing against said front end.

30. An apparatus as in claim 26, wherein said carriage comprises an actuator means for actuating switches, adapted to indicate particular positions of said shuttle means.

31. An apparatus as in claim 26, wherein said shuttle tooling assembly further comprises a retriever reciprocatable between an extended position and a retracted position and a clamp reciprocatable, relative to said retriever, between a clamped position and a retracted clamped position.

32. An apparatus for inserting electronic components, said electronic components having a body and a single series of in-line leads extending from a surface of said body, said apparatus comprising a component supply assembly having individual magazines for supply of said components one at a time, extensible and retractable shuttle means for retrieving individual components from said component supply means and transporting said components to an unload station, movable component insertion means adjacent to said unload station, said component insertion means including a component pickup means for transfer of said components from said shuttle means to said insertion means at said unload station, means for receiving rejected components that are not transferred to said insertion means from said shuttle means, a delivery assembly having a slide support means for said shuttle means and drive means for imparting lateral movement to said shuttle means along said slide support means, said insertion means comprising a support block and an insert head tooling assembly rotatably supported by said support block, said support block including a rotate means for rotating said insert head tooling assembly between a first position and a second position, said insert head tooling assembly comprising a reciprocatable insert head and an insert actuator means for extending and retracting said insert head, said pickup means comprising a vacuum block means for holding said component in engagement with said insert head, said vacuum block means being attached to said insert head.

33. An apparatus as in claim 32, wherein said insert head tooling assembly further comprises an alignment means for alignment of said component on said vacuum block means.

34. An apparatus as in claim 32, wherein said insert head tooling assembly further comprises an alignment means attached to said insert head and comprising pivotal finger means for grasping said leads of said component and aligning said component on said insert head.

* * * * *